United States Patent
Chang et al.

(10) Patent No.: US 12,068,300 B2
(45) Date of Patent: Aug. 20, 2024

(54) CHIP-ON-WAFER-ON-SUBSTRATE PACKAGE WITH IMPROVED YIELD

(71) Applicant: Taiwan Semiconductor Manufacturing Company, Ltd., Hsinchu (TW)

(72) Inventors: Chia-Wei Chang, Taipei (TW); Ju-Min Chen, Tainan (TW); Jyun-Lin Wu, Hsinchu (TW); Yao-Chun Chuang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 345 days.

(21) Appl. No.: 17/680,523

(22) Filed: Feb. 25, 2022

(65) Prior Publication Data
US 2023/0275077 A1    Aug. 31, 2023

(51) Int. Cl.
| | |
|---|---|
| H01L 25/18 | (2023.01) |
| H01L 23/00 | (2006.01) |
| H01L 23/31 | (2006.01) |
| H01L 23/498 | (2006.01) |
| H01L 23/538 | (2006.01) |
| H01L 25/00 | (2006.01) |

(52) U.S. Cl.
CPC .......... *H01L 25/18* (2013.01); *H01L 23/3157* (2013.01); *H01L 23/49816* (2013.01); *H01L 23/5383* (2013.01); *H01L 23/5384* (2013.01); *H01L 23/562* (2013.01); *H01L 25/50* (2013.01)

(58) Field of Classification Search
CPC .............. H01L 25/18; H01L 23/3157; H01L 23/49816; H01L 23/5383; H01L 23/5384
See application file for complete search history.

(56) References Cited

U.S. PATENT DOCUMENTS

| | | | | |
|---|---|---|---|---|
| 11,728,278 B2 * | 8/2023 | Lu | .................. | H01L 25/105 257/668 |
| 11,749,610 B2 * | 9/2023 | Lin | ................... | H01L 23/49811 257/774 |
| 11,791,233 B1 * | 10/2023 | Mathuriya | .............. | G06F 1/329 257/295 |
| 11,923,310 B2 * | 3/2024 | Cheng | ................. | H01L 23/5384 |
| 11,923,315 B2 * | 3/2024 | Tsai | .................... | H01L 21/6835 |

(Continued)

*Primary Examiner* — Thao P Le
(74) *Attorney, Agent, or Firm* — Lippes Mathias LLP

(57) ABSTRACT

A chip-on-wafer-on-substrate (CoWoS) semiconductor assembly is formed which includes a chip-on-wafer (CoW) sub-assembly of integrated circuit (IC) dies mounted on an interposer, which is in turn mounted on a package substrate with a top metallization stack and a bottom metallization stack using bonding bumps connecting the backside of the interposer and the front side of the package substrate. The bonding bumps provide electrical connections between the ends of through-vias exposed at the backside of the interposer and the top metallization stack of the package substrate. The likelihood of certain failure mechanisms that can adversely affect CoWoS yield are reduced or eliminated by ensuring a total metal thickness of the top metallization stack is greater than a total metal thickness of the bottom metallization stack, but not so much greater as to induce cracking of the underfill material during curing thereof.

20 Claims, 5 Drawing Sheets

(56) References Cited

U.S. PATENT DOCUMENTS

| | | | |
|---|---|---|---|
| 2023/0154912 A1* | 5/2023 | Chern | H01L 25/18 |
| | | | 257/737 |
| 2023/0187362 A1* | 6/2023 | Elsherbini | H01L 24/08 |
| | | | 257/668 |
| 2023/0260978 A1* | 8/2023 | Kuo | H01L 25/167 |
| | | | 257/432 |
| 2023/0282614 A1* | 9/2023 | Hsieh | H01L 23/3171 |
| | | | 257/700 |

* cited by examiner

US 12,068,300 B2

CHIP-ON-WAFER-ON-SUBSTRATE PACKAGE WITH IMPROVED YIELD

BACKGROUND

The following relates to semiconductor chip packaging arts, chip-on-wafer-on-substrate (CoWoS) packaging arts, and related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
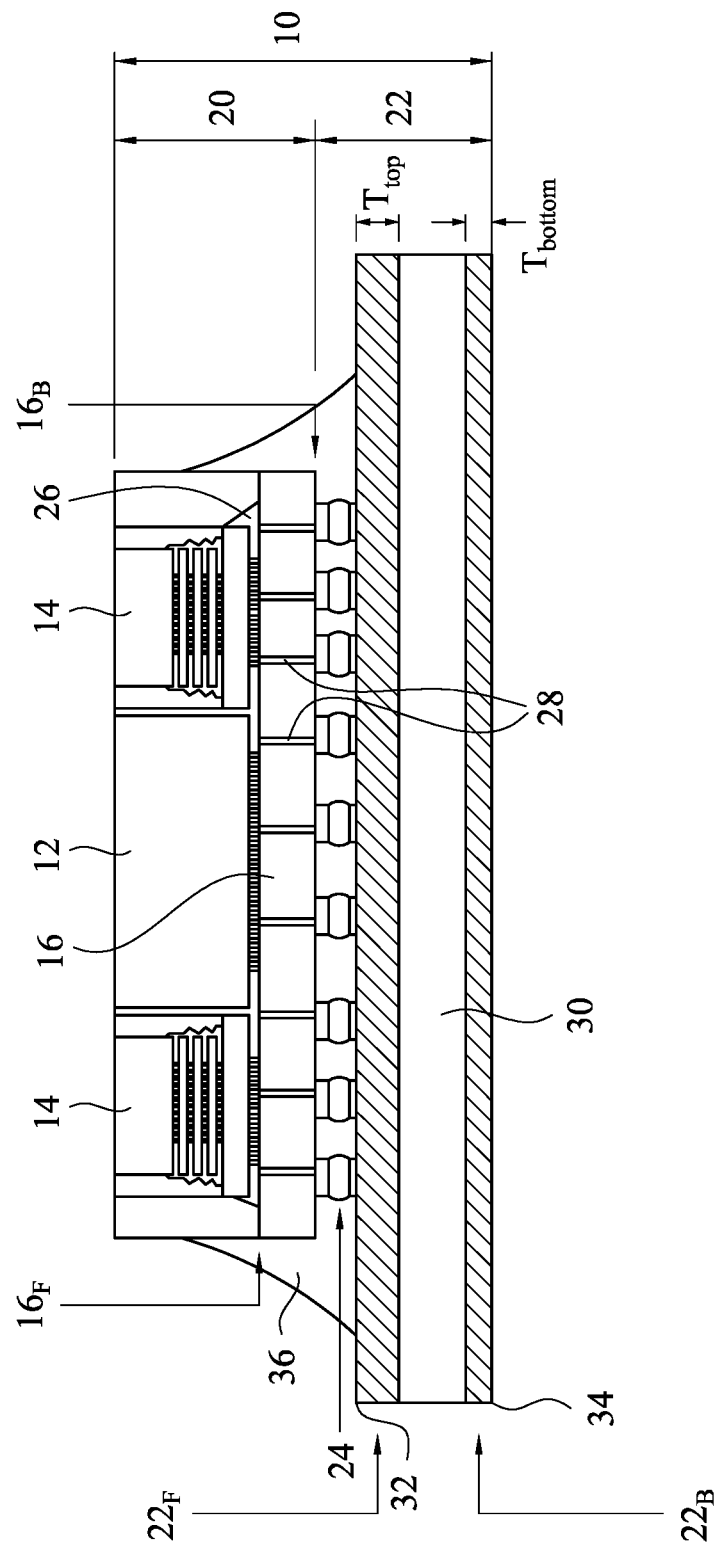
FIG. 1 diagrammatically illustrates a cross-sectional view of a chip-on-wafer-on-substrate (CoWoS) package.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments disclosed herein, a chip-on-wafer-on-substrate (CoWoS) semiconductor assembly is formed which includes a chip-on-wafer (CoW) sub-assembly of integrated circuit (IC) dies mounted on an interposer, which CoW sub-assembly is in turn mounted on a package substrate with a top metallization stack and a bottom metallization stack by way of bonding bumps connecting the backside of the interposer and the front side of the package substrate. The bonding bumps provide electrical connections between the ends of through-vias exposed at the backside of the interposer and the top metallization stack of the package substrate. In embodiments disclosed herein, the likelihood of certain failure mechanisms that can adversely affect CoWoS yield are reduced or eliminated by ensuring a total metal thickness of the top metallization stack is greater than a total metal thickness of the bottom metallization stack.

In some such embodiments, the total metal thicknesses of the respective top and bottom metallization stacks are further designed to avoid cracking of an underfill material interposed between the CoW sub-assembly and the package substrate. This design entails ensuring that while the total metal thickness of the top metallization stack is greater than the total metal thickness of the bottom metallization stack, it is not too much greater so as to produce underfill cracking.

These and other aspects are further described in detail hereinbelow.

With reference to FIG. 1, a chip-on-wafer-on-substrate (CoWoS) package 10 is diagrammatically shown in cross-sectional view. In a suitable process for fabricating the CoWoS package, integrated circuit (IC) dies 12, 14 are bonded to a wafer 16 (also known as an interposer wafer 16, and sometimes referred to herein as an interposer 16) using micro-bumps 18 to form a chip-on-wafer (CoW) wafer 20 which in turn is bonded to a package substrate 22 (sometimes referred to herein more generally as the substrate 22) by way of bonding bumps 24. It should be noted that FIG. 1 shows the illustrative single CoWoS package 10 after singulation (i.e. dicing) of the bonded assembly of the interposer wafer 16 and the package substrate 22. Prior to singulation, the interposer wafer 16 and the package substrate 22 are each of relatively large size, e.g. the interposer wafer 16 may be several centimeters on a side (for a non-limiting illustrative square interposer wafer example) or diameter (for a non-limiting illustrative circular interposer wafer example), with the package substrate 22 being as large or larger in area than the interposer wafer 16. A large number of CoWoS packages may be produced by dicing of the CoWoS wafer assembly.

The interposer wafer 16 is typically a silicon wafer or a wafer comprising another semiconductor material, and has a frontside $16_F$ on which the IC dies are mounted and an opposite backside $16_B$. The IC dies 12, 14 are mounted to the frontside $16_F$ of the interposer wafer 16. The illustrative IC dies 12, 14 include a system-on-a-chip (SoC) die 12 and high bandwidth memory (HBM) chips 14. For example, the SoC die 12 may comprise an IC including a central processing unit (CPU), memory, input/output ports, digital and/or analog signal processing circuitry, radio frequency (RF) radio circuitry, and/or so forth. These are merely nonlimiting illustrative examples, and more generally any type or types of IC dies can be included in the CoW wafer, e.g. field-programmable gate array (FPGA) dies, RF chips of various types, and/or so forth. Typically, after mounting the IC dies 12, 14 an underfill material 26 is disposed between the IC dies 12, 14 and the interposer wafer 16 to protect that interface and provide improved structural stability for the CoW wafer. More particularly, the underfill material 26 is disposed between the frontside $16_F$ of the interposer wafer 16 and the IC dies 12, 14, and may fill in the space between the micro-bumps 18. This underfill 26 is sometimes referred to as the first underfill, or as UF1. The underfill material of UF1 26 may, by way of nonlimiting illustrative example, comprise an epoxy molding compound, a silicone molding compound, a resin molding compound, or another electrically nonconductive molding compound.

After mounting the IC dies 12, 14 on the interposer wafer 16 and applying first underfill UF1 26, the interposer wafer 16 is thinned from its backside $16_B$ prior to bonding the CoW wafer to the front side $22_F$ of the package substrate 22. The interposer wafer 16 has through-silicon vias 28 (TSVs 28; this name assuming a silicon interposer as an example) that are exposed at the backside $16_B$ of the interposer wafer 16 by the backside thinning. The interposer wafer 16 may optionally include additional features which are not shown in FIG. 1, such as a stack of metallization layers, e.g. comprising copper or a copper alloy, which are separated by intermetal dielectric (IMD) material, and this stack may further optionally include circuit components such as integrated metal-insulator-metal (MIM) capacitors for RF decoupling or other purposes.

The CoW wafer 20 thus forms a wafer-level sub-assembly that is bonded by way of the backside $16_B$ of the interposer wafer 16 to the package substrate 22 (and more particularly to the front side $22_F$ of the substrate 22) via the bonding bumps 24, which electrically contact the exposed ends of the TSVs 28 at the backside $16_B$ of the interposer wafer 26. The package substrate 22 includes a planar core 30 comprising a core material with a low coefficient of thermal expansion (low CTE), for example a low CTE resin laminate or other low CTE dielectric material or material laminate. By way of nonlimiting illustrative example, in some embodiments the planar core 30 of the package substrate 22 is an E-705 or E-795 series low CTE core available from Showa Denko Materials Co., Ltd. (Tokyo, Japan); for example E-705G, E-705GX, E-705GL, E-705GLH, E-795G, E-795GX, E-795GL, E-795GLH, or so forth. In some nonlimiting illustrative embodiments, the planar core 30 has a low in-plane CTE over the temperature range 30-120° C. of 15 ppm/° C. (i.e., 15 parts-per-million per degree Celsius) or less. In some nonlimiting illustrative embodiments, the planar core 30 has a low in-plane CTE over the temperature range 30-120° C. of 10 ppm/° C. or less. By way of nonlimiting illustration, some E-705 series low CTE cores have in-plane CTE values over the temperature range 30-120° C. of between 3 ppm/° C. and 7 ppm/° C. By "in-plane" it is meant the CTE in the plane of the planar core 30.

The interposer 16 of the CoW 20 is bonded to the substrate using the bonding bumps 24 of copper, copper alloy, or the like (for example, bonding bumps referred to in the industry as C4 bumps). The package substrate 22 also typically includes multiple metallization layers separated by IMD material, diagrammatically indicated in FIG. 1 as a top metallization stack 32 and a bottom metallization stack 34, and has through-vias (not shown in FIG. 1; but see FIG. 4) passing through the low CTE planar core 30 to electrically interconnect the top and bottom metallization stacks 32 and 34. Thus, the front side $22_F$ of the package substrate 22 comprises the top metallization stack 32, which includes top electrical contacts of the package substrate 22 that are aligned with corresponding exposed ends of the TSVs 28 exposed at the backside $16_B$ of the interposer wafer 16 to provide electrical connections between the CoW wafer 20 and the top metallization stack 32 of the package substrate 22 (and further, by way of through-vias passing through the planar core 30, with the bottom metallization stack 34 of the package substrate 22). The backside $22_B$ of the package substrate 22 includes the bottom metallization stack 34. Although not illustrated, the bottom metallization stack 34 typically includes electrical contact pads (see FIG. 4) for enabling the final CoWoS package 10 (after singulation) to be bonded to a printed circuit board (PCB) of a device or system by way of a ball grid array (BGA) of solder bumps or the like, in a technique known as BGA packaging.

After bonding the CoW wafer 20 to the package substrate 22 (and more particularly bonding the backside $16_B$ of the interposer 16 to the front side $22_F$ of the package substrate 22), an underfill material 36 is disposed between the CoW wafer 20 and the package substrate 22 (and more particularly disposed between the backside $16_B$ of the interposer 16 to the front side $22_F$ of the package substrate 22) to protect that interface and provide improved structural stability for the CoWoS wafer. The underfill 36 may fill the space between the bonding bumps 24. The underfill 36 is sometimes referred to as the second underfill, or as UF2, since it is applied after first underfill UF1 26. The underfill material of UF2 36 may, by way of nonlimiting illustrative example, comprise an epoxy molding compound, a silicone molding compound, a resin molding compound, or another electrically nonconductive molding compound.

The resulting wafer-level CoWoS then undergoes singulation (i.e. dicing) to separate individual CoWoS packages such as the CoWoS package 10 diagrammatically depicted by cross-sectional view in FIG. 1, which are then mounted to a PCB or the like using a ball grid array (BGA) of solder bumps or the like.

For various reasons such as heat sinking to a metal core of the circuit board and obtaining a low profile CoWoS package for use in devices such as cellular telephones (cellphones), notebook or tablet computers, or other low-profile electronics, it is desirable for the package substrate 22 to be relatively thin, e.g. on the order of one to a few millimeters thick in some non-limiting embodiments. A thin substrate can be prone to warpage during thermal processing, which can result in low yield for the bonding of the CoW to the package substrate.

The use of a low CTE planar core in the package substrate is conventionally considered to address this problem. The CTE for silicon is low, at about 3 ppm/° C., so employing a core with a comparable CTE (e.g., between 3 ppm/° C. and 7 ppm/° C. over 30-120° C. for an E-705 series low CTE core) might be expected to resolve the package substrate warpage problem.

However, it is recognized herein that, even in the case of a package substrate comprising a low CTE planar core, sufficient substrate warpage can still occur during the curing of the UF2 36 to induce defects that adversely impact yield. Without being limited to any particular theory of operation, the warpage is believed to be due to the increase in volume of the underfill 36 due to thermal expansion during its curing. It is further disclosed herein that this problem can be addressed by adjusting the total thicknesses of the copper or other metal of the top and bottom metallization stacks 32, 34 of the package substrate 22.

With returning reference to FIG. 1, in the examples given herein, the total thickness of the copper or other metal of the top metallization stack 32 is denoted as $T_{top}$, and the total thickness of the copper or other metal of the bottom metallization stack 34 is denoted as $T_{bottom}$. These total thickness values are the sum of the thicknesses of the copper (or other metallization metal) only, and exclude the thicknesses of the intermetal dielectric (IMD) material disposed between the metal layers of each metallization stack.

Figure 2:
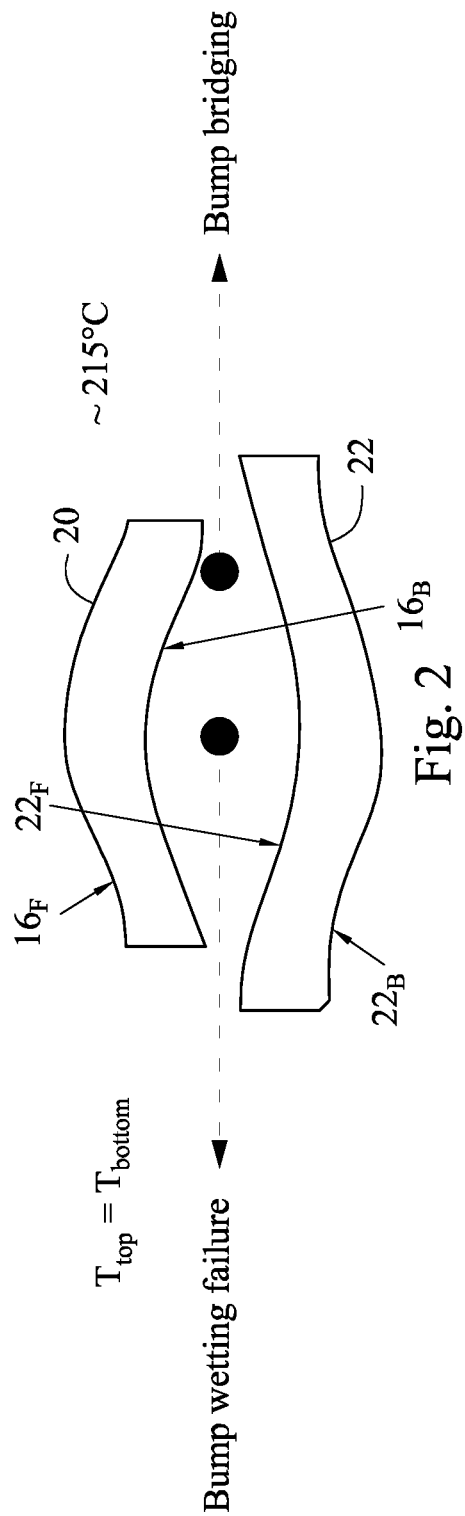
FIG. 2 presents a diagrammatic representation of warpage of the chip-on-wafer (CoW) wafer and the package substrate at about 215° C. for a case where the total top metal thickness ($T_{top}$) and total bottom metal thickness ($T_{bottom}$) are equal.

FIG. 2 depicts a simplified cross-sectional representation of the CoW wafer 20 bonded to the package substrate 22 via the bonding bumps 24 (not shown in FIG. 2, see FIG. 1) after bonding at about room temperature (e.g., about 25-30° C.), applying the underfill UF2 36, and then heated to an elevated temperature of about 215° C. For the example of FIG. 2, $T_{top}=T_{bottom}$—that is, the total metal thickness $T_{top}$ of the top metallization stack 32 of the package substrate 22 is equal to the total metal thickness $T_{bottom}$ of the bottom metallization stack 34 of the package substrate 22. In isolation, this symmetry would result in the package substrate 22 expanding in-plane uniformly, with no warpage of the package substrate. The thermal expansion of the CoW 20 would be relatively small since the silicon (assuming a silicon interposer 16) has a low CTE of around 3 ppm/° C., and again in isolation the CoW 20 would be expected to expand in-plane uniformly, with little or no warpage except possibly for warpage induced by the mounted IC dies 12, 14.

However, as shown in FIG. 2, in the CoWoS assembly the CoW 20 is warped by the heating into a concave-downward (or equivalently, convex-upward) direction (for the orientation shown in FIGS. 1 and 2). Put another way, the front side surface $16_F$ of the interposer wafer 16 of the CoW wafer 20 is warped to be convex, especially near the center of the CoW wafer 20, while the backside $16_B$ of the interposer wafer 16 of the CoW wafer 20 is warped to be concave, again especially near the center of the CoW wafer 20. (Note that in FIG. 2 the IC dies 12, 14 shown in FIG. 1 are not shown for simplicity).

The package substrate 22 is warped in the opposite direction, i.e. the package substrate 22 is warped by the heating into a warpage in the concave-upward (or equivalently, convex-downward) direction. Put another way, the front side surface $22_F$ of the package substrate 22 is warped to be concave, especially near the center of the package substrate 22, while the backside $22_B$ of the package substrate 22 is warped to be convex, again especially near the center of the package substrate 22.

Without being limited to any particular theory of operation, it is believed this warpage of the CoW wafer 20 and package substrate 22 in opposite directions is due to thermal expansion of the volume of the underfill UF2 36 that is disposed between the CoW wafer 20 and package substrate 22. The thermal expansion of the underfill UF2 36 produces an outward force that presses most strongly at the center of the CoWoS assembly to produce the convex-upward warpage of the CoW wafer 20 and the convex-downward warpage of the package substrate 22.

In actually performed experiments, this warpage in opposite directions diagrammatically shown in FIG. 2 was found by post-heating microscopy to result in two potential mechanisms of yield loss: (i) bump wetting failure of the bonding bumps 24 near the center of the CoWoS assembly potentially resulting in inadequate electrical contact or even electrical opens between the through-vias 28 of the CoW 20 and the top metallization stack 32 of the package substrate 22; and (ii) bump bridging of the bonding bumps 24 at peripheral regions of the CoWoS assembly potentially resulting in electrical shunting or even shorting across neighboring bonding bumps. These failure mechanisms are diagrammatically denoted in FIG. 2. The bump wetting failure near the center of CoWoS assembly can be understood as resulting from the increased separation between the backside $16_B$ of the interposer wafer 16 and front side $22_F$ of the package substrate 22 near the center of the CoWoS assembly, which results in the bonding bumps 24 in that central area needing to bridge a larger gap. The bump bridging at the peripheral regions of the CoWoS assembly can be understood as resulting from decreased separation between the backside $16_B$ of the interposer wafer 16 and front side $22_F$ of the package substrate 22 at the periphery which can distort or flatten the bonding bumps 24 at the periphery of the CoWoS assembly.

Figure 3:
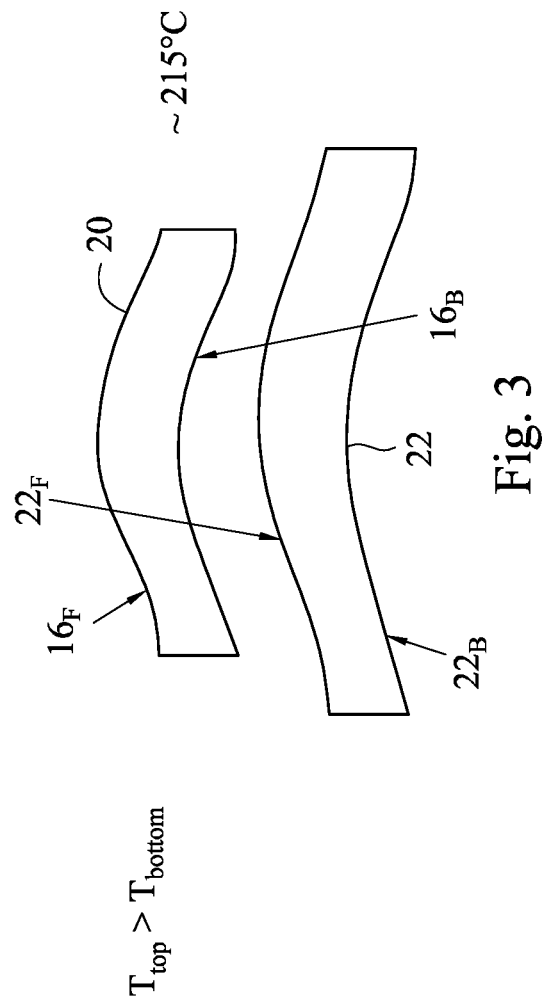
FIG. 3 presents a diagrammatic representation of warpage of the CoW wafer and the package substrate at about 215° C. for a case where the total top metal thickness ($T_{top}$) is greater than the total bottom metal thickness ($T_{bottom}$).

With reference to FIG. 3, the foregoing problems are remediated by modifying the package substrate 22 to have the total metal thickness $T_{top}$ of the top metallization stack 32 of the package substrate 22 be greater than the total metal thickness $T_{bottom}$ of the bottom metallization stack 34 of the package substrate 22—that is, in the example of FIG. 3 $T_{top}>T_{bottom}$. This addresses the problem by reversing the direction of the warpage of the package substrate 22 so that it is in the same direction as the warpage of the CoW wafer 20, as diagrammatically shown in FIG. 3. In other words, in the example of FIG. 3 the package substrate 22 is now warped by the heating into a warpage in the convex-upward (or equivalently, concave-downward) direction. Put another way, the front side surface $22_F$ of the package substrate 22 is now warped to be convex, especially near the center of the package substrate 22, while the backside $22_B$ of the package substrate 22 is warped to be concave, again especially near the center of the package substrate 22. This matches the convex-upward/concave-downward warping of the CoW wafer 20. Consequently, bump wetting failure of bonding bumps 24 near the center of the CoWoS assembly is resolved because the two components 20 and 22 warp in the same direction so that the spacing is not increased near the center of the CoWoS assembly. Likewise the bump bridging of bonding bumps 24 at peripheral regions of the CoWoS assembly is resolved because the two components 20 and 22 warp in the same direction so that the spacing is not decreased at the periphery of the CoWoS assembly.

Without being limited to any particular theory of operation, it is believed this advantageous reversed-direction warpage of the package substrate 22 for $T_{top}>T_{bottom}$ compared with its warpage in the example of FIG. 2 for $T_{top}=T_{bottom}$ is due to the thicker top metallization stack 32 compared with the bottom metallization stack 34 producing a thermal expansion countering the force produced by the expanding UF2 36. This is because the metallization stacks 32 and 34 have a larger in-plane CTE than the planar core 30 of the package substrate 22. For example, in some embodiments the core 30 has an in-plane CTE of 15 ppm/° C. or less over a temperature range of 30-120° C., and as some nonlimiting specific examples some E-705 series low CTE cores have in-plane CTE values over the temperature range 30-120° C. of between 3 ppm/° C. and 7 ppm/° C. By comparison, copper has an in-plane CTE of about 17 ppm/° C. in this temperature range. Since $T_{top}>T_{bottom}$ for the example of FIG. 3, the higher CTE of the thicker top copper versus the thinner lower copper drives the package substrate 22 to warp in the convex-upward/concave-downward direction.

However, further experiments performed for CoWoS assemblies in which the package substrate had $T_{top}>T_{bottom}$ found that there is a limit to how much larger $T_{top}$ can be made compared with $T_{bottom}$. If $T_{top}$ is too much larger than $T_{bottom}$, then the underfill UF2 can crack, which constitutes a different failure mode that can also adversely impact yield. Without being limited to any particular theory of operation, it is believed the UF2 cracking when $T_{top}$ is too much larger than $T_{bottom}$ results because as the total top metal thickness $T_{top}$ is made increasingly larger than the bottom metal thickness $T_{bottom}$, this increases convexity of the convex-upward warpage of the package substrate 22 thus increasing the compression of the underfill UF2 during the curing. For $T_{top}$ that is too much larger than $T_{bottom}$, this high compression results in underfill cracking. Put another way, the convex-upward warpage of the substrate achieved by $T_{top} > T_{bottom}$ introduces a compressive force that counters the thermal expansion of the underfill—but if this compressive force is too high then the underfill may crack.

Figure 4:
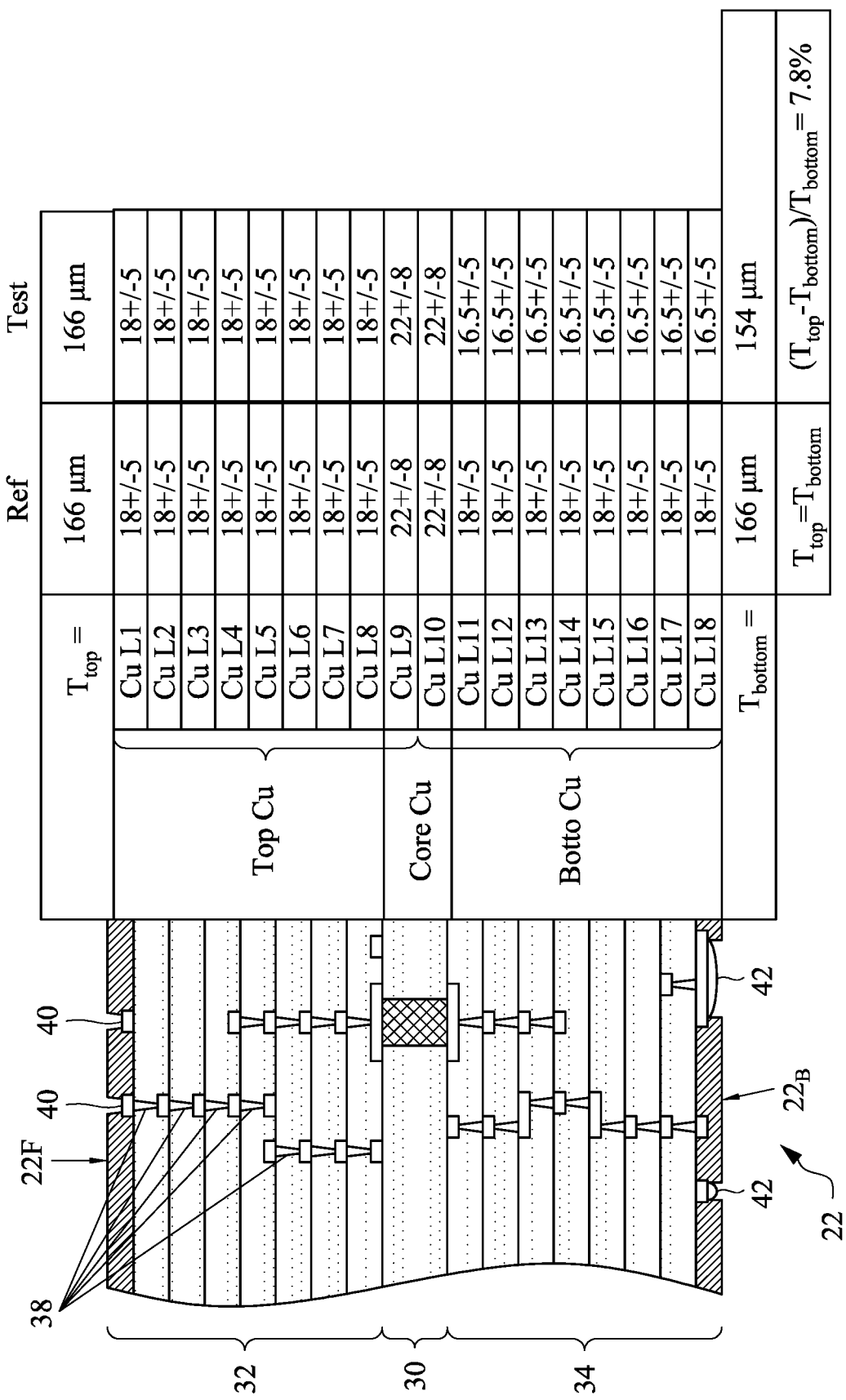
FIG. 4 diagrammatically illustrates cross-sections of two example nominal package substrate specifications: a reference ("Ref") package substrate specification having $T_{top}=T_{bottom}$, and a test package substrate specification ("Test") having $T_{top}>T_{bottom}$, along with thicknesses measured for a package substrate fabricated in accordance with the test package specification.

With reference to FIG. 4, tests were run on a sample structure to determine suitable relative values for the total top metal thickness $T_{top}$ compared with the total bottom metal thickness $T_{bottom}$. With reference to FIG. 4, the tested examples of the package substrate 22 are shown. In each case, the top metallization stack 32 included nine layers of copper labeled as "Cu L1" . . . "Cu L9" in FIG. 4, and the bottom metallization stack 34 also included nine layers of copper labeled as "Cu L10" . . . "Cu L18" in FIG. 4. The core 30 of each package substrate was an E705-series core which came with 22 micron plated copper on the front and backsides of the core. The upper 22 micron plated copper formed layer "Cu L9" of the top metallization stack 32, and similarly the lower 22 micron plated copper formed layer "Cu L10" of the bottom metallization stack 34. The lefthand side of FIG. 4 shows a diagrammatic cross-sectional view of the package substrate 22 including the core 30 and upper and lower metallization stacks 32 and 34. For further illustration, this diagrammatic cross-sectional view shows example vias 38 passing through the intermetal dielectric (IMD) material disposed between neighboring copper layers to provide electrical interconnectivity therebetween, along with topside electrical contacts 40 at the frontside $22_F$ of the package substrate 22 formed into the uppermost copper layer "Cu L1" of the top metallization stack 32 and bottom-side electrical contacts 42 at the backside $22_B$ of the package substrate 22 formed into the lowermost copper layer "Cu L18" of the bottom metallization stack 34. The topside electrical contacts 40 electrically contact with the exposed lower ends of the through-silicon vias 28 of the (in this embodiment silicon) interposer wafer 16 by way of the micro-bumps 18, and the bottom-side electrical contacts 42 serve as contact pads for solder bumps (not shown) of a ball grid array (BGA) for installing the final CoWoS assembly on a printed circuit board.

The righthand side of FIG. 4 shows a table representing the copper layer thicknesses of copper layers "Cu L1" . . . "Cu L9" of the top metallization stack 32 and of copper layers "Cu L10" . . . "Cu L18" of the bottom metallization stack 34 for a "Ref" (i.e. reference) package substrate and for a "Test" package substrate. As seen in FIG. 4, the "Ref" substrate has every copper layer "Cu L1" . . . "Cu L18" equal to 18 (±5) microns, except for the innermost layers "Cu L9" and Cu L10" which are 22 (±8) microns thick, these corresponding to the native copper plating of the core 30. Hence, for the "Ref" structure, $T_{top}$=166 microns, $T_{bottom}$=166 microns, and hence $T_{top}=T_{bottom}$.

For the "Test" package substrate, the top metallization stack 32 is identical with that of the "Ref" substrate, and hence $T_{top}$=166 microns. However, the thickness of each of the layers "Cu L11" through "Cu L18" of the bottom metallization stack 34 in the "Test" substrate is reduced to 16.5 (±5) microns, yielding $T_{bottom}$=154 microns, and hence $T_{top} > T_{bottom}$ for the "Test" structure.

As previously noted, the condition $T_{top} > T_{bottom}$ generally provides for the package substrate 22 to desirably warp in the same direction as the CoW wafer 20 during the curing of the second underfill UF2 36, as diagrammatically shown in FIG. 3. However, as also previously noted, if $T_{top}$ is much larger than $T_{bottom}$ then this can result in undesirable cracking of UF2. To further quantify the relationship between $T_{top}$ and $T_{bottom}$ of the respective upper and lower metallization stacks 32 and 34, the following expression is used herein:

$$\frac{(T_{top} - T_{bottom})}{T_{bottom}} \quad (1)$$

which provides a metric for the relative difference between $T_{top}$ and $T_{bottom}$. While this choice of metric is used herein, it will be appreciated that other similar metrics may be employed, such as $$\frac{(T_{top} - T_{bottom})}{(T_{top} + T_{bottom})} \text{ or } \frac{(T_{top} - T_{bottom})}{T_{bottom}} \text{ or } \frac{T_{top}}{T_{bottom}}.$$

The desirable warpage of FIG. 3 is expected to be achieved for relatively small values of this metric, e.g. for:

$$\frac{(T_{top} - T_{bottom})}{T_{bottom}} \geq 0.01 \quad (2)$$

In some embodiments, with the convexity of the convex-upward warpage of the package substrate 22 generally increasing with increasing value of $$\frac{(T_{top} - T_{bottom})}{T_{bottom}}.$$

As indicated at the bottom right of the table of FIG. 4, for the "Test" structure of FIG. 4 the value of the metric is $$\frac{(T_{top} - T_{bottom})}{T_{bottom}} \geq 0.078 \text{ or,}$$

equivalently, $$\frac{(T_{top} - T_{bottom})}{T_{bottom}} \geq 7.8\%.$$

For this example, no cracking of the second underfill UF2 was observed. However, for test runs with the total metal thickness $T_{bottom}$ of the bottom metallization further reduced (that is, with smaller values of $T_{bottom}$ than $T_{bottom}$=154 microns), cracking of the UF2 was observed. These experiments indicate that a preferred value for the metric for the illustrative "Test" substrate structure of FIG. 4 is:

$$\frac{(T_{top} - T_{bottom})}{T_{bottom}} \leq 0.08 \quad (3)$$

However, this is for that specific substrate structure, which uses an E-705 series low CTE core and nine metal layers for each of the upper and lower metallization stacks. For some other low CTE planar cores (where "low CTE" of the planar core in this context may have an in-plane CTE of 15 ppm/° C. or less over a temperature range of 30-120° C., compared with about 17 ppm for copper in this temperature range) and/or different metallization stack configurations and/or different curing temperatures and/or curing times, a more relaxed condition of:

$$\frac{(T_{top} - T_{bottom})}{T_{bottom}} \leq 0.12 \quad (4)$$

is expected to generally hold, with the specific upper limit on metric $$\frac{(T_{top} - T_{bottom})}{T_{bottom}}$$

for a specific core and metallization stacks being sometimes smaller (e.g. ~8% for the "Test" substrate structure of FIG. 4) and suitably determined experimentally.

Figure 5:
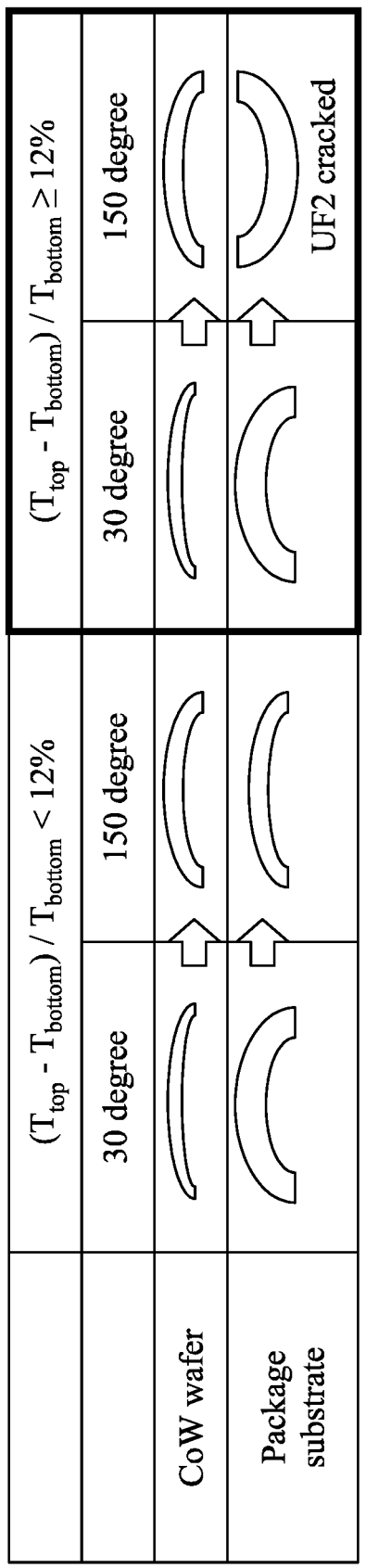
FIG. 5 diagrammatically shows further examples of warpage of the CoW wafer and package substrate for relative values of $T_{top}$ and $T_{bottom}$.

With reference to FIG. 5, depending on the detailed configuration of the CoW wafer 20, the choice of substrate core 30, and the value of the metric $$\frac{(T_{top} - T_{bottom})}{T_{bottom}}$$

for the package substrate 22 and possibly other factors, there may be some warpage of the CoW wafer 20 and/or the package substrate 22 in the CoWoS assembly even before the second underfill UF2 36 is cured. In the diagrammatic examples of FIG. 5 there is some concave-upward warping of both the CoW wafer 20 and the package substrate 22 at 30° C. (that is, before the curing). In this example the UF2 cure is performed at 150° C., and due to the condition $T_{top} > T_{bottom}$ for the examples of FIG. 5 the concave-upward warping of the package substrate 22 is expected to be maintained at this curing temperature when the condition (4) above is met. However, for the righthand example of FIG. 5, $$\frac{(T_{top} - T_{bottom})}{T_{bottom}} \geq 0.12$$

and in this case cracking of the underfill UF2 is expected after curing at 150° C.

Again, these are illustrative examples, and whether UF2 cracking is observed and (if so observed) the precise curing temperature at which UF2 cracking occurs will depend on the detailed construction/warpage of the CoW wafer 20 and the detailed construction of the package substrate 22, such as the CTE of the core 30 and the value of the metric $$\frac{(T_{top} - T_{bottom})}{T_{bottom}}.$$

In the illustrative example of FIG. 4, the top metallization stack 32 has nine layers and the bottom metallization stack 34 also has nine layers. In this case, adjustment of the $$\frac{(T_{top} - T_{bottom})}{T_{bottom}}$$

ratio entails adjusting thickness of one or more of the constituent metal layers. Specifically, in the "Test" example of FIG. 4 each of the bottom stack layers "Cu L11" through "Cu L18" was reduced in thickness by about 9% compared with the reference ("Ref") design to achieve $$\frac{(T_{top} - T_{bottom})}{T_{bottom}} = 7.8\%.$$

In another example (not shown in FIG. 4), the thicknesses of the top stack layers "Cu L1" through "Cu L8" could be increased by about 9% to achieve a similar value for the metric $$\frac{(T_{top} - T_{bottom})}{T_{bottom}}.$$

In yet another example, a combination of increasing thicknesses of the metal layers of the upper metallization stack and decreasing thicknesses of the metal layers of the bottom metallization stack can be used to obtain a desired $$\frac{(T_{top} - T_{bottom})}{T_{bottom}}$$

ratio.

In other examples, the metal layer thicknesses may be kept the same and instead the number of metal layers in the top metallization stack 32 may be larger than the number of metal layers in the bottom metallization stack 34 in order to achieve the desired conditions such as $T_{top} > T_{bottom}$ and a desired value for the $$\frac{(T_{top} - T_{bottom})}{T_{bottom}}$$

ratio.

Figure 6:
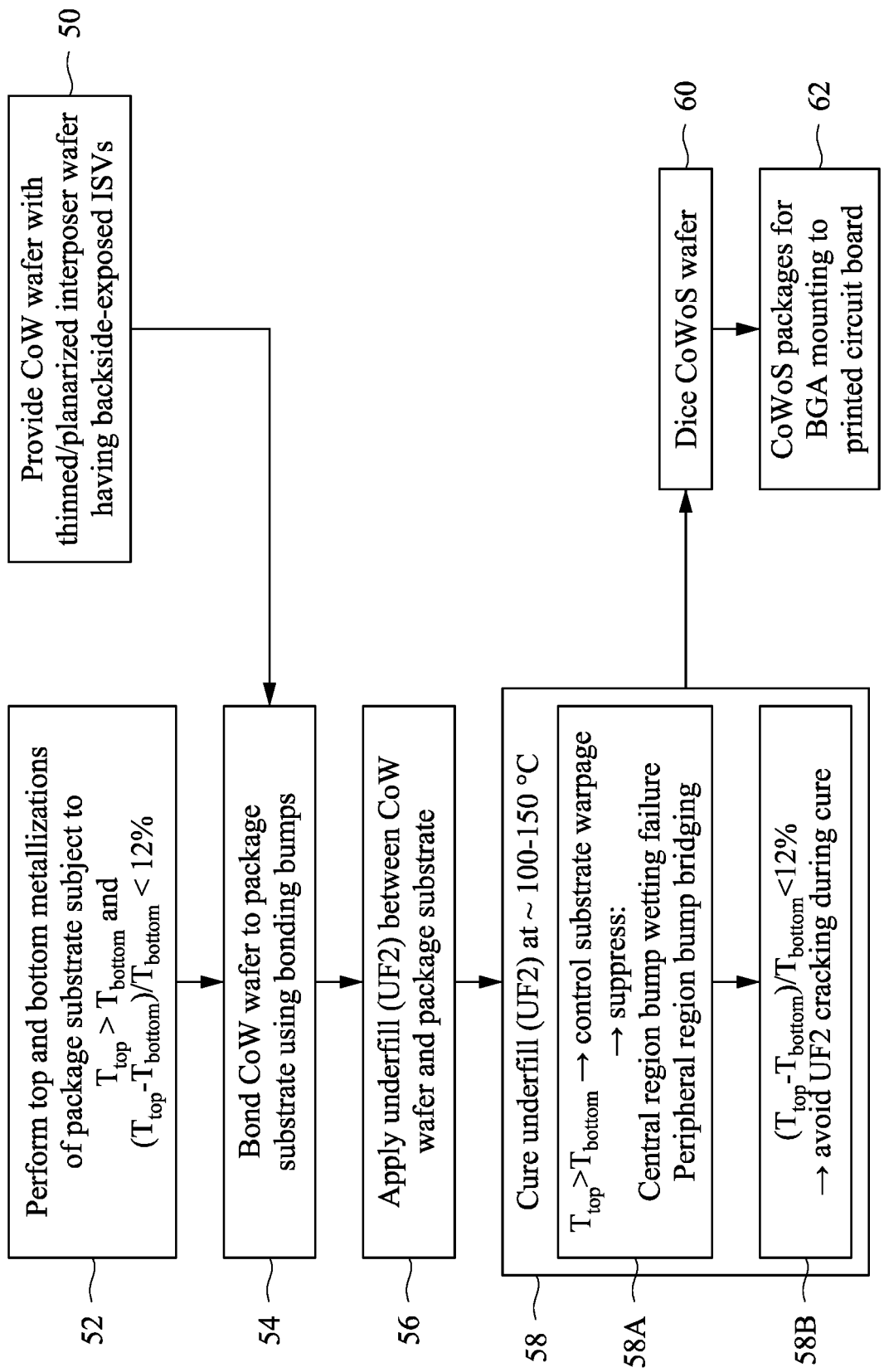
FIG. 6 diagrammatically illustrates a processing workflow for securing a CoW sub-package to a package substrate to from a CoWoS package.

With reference to FIG. 6 and further reference back to FIG. 1, a CoWoS semiconductor assembly method is diagrammatically shown. A CoW wafer is provided in an operation 50, which includes a backside thinned and planarized interposer wafer 16 having backside-exposed inter-silicon vias (ISVs) 28. As previously described with reference to FIG. 1, construction of the CoW wafer provided in operation 50 may entail mounting IC chips 12, 14 on the interposer wafer 16 via micro-bumps 18, and applying and curing the first underfill 26. The output of the operation 50 is the CoW wafer 20 of FIG. 1.

In an operation 52, starting with a core 30 (which may optionally be supplied by a vendor with plated copper on one or both sides), the top metallization stack 32 and bottom metallization stack 34 are formed on the respective front and backsides of the core to form the package substrate 22. This entails depositing layers of metal (e.g. copper or copper alloy) spaced apart by intervening layers of intermetal dielectric (IMD) material. These depositions can employ any suitable material deposition technique, e.g. plating, vacuum deposition, sputtering, or so forth. The operation 52 may also include patterning operations to pattern each metal layer (e.g., each of layers "Cu L1" . . . "Cu L18" in the example of FIG. 4) to form interconnect lines or structures, and etching/deposition steps to define vias between the metallization layers (e.g., vias 38 shown in FIG. 4). The detailed patterning and vias layout depends on the circuitry of the CoWoS assembly. The output of the operation 52 is the package substrate 22 of FIG. 1.

In an operation 54, the CoW wafer 20 provided in operation 50 is bonded to the package substrate 22 produced by the operation 52. The bonding operation 54 is performed using the bonding bumps 24 as indicated in FIG. 1. In an operation 56, the (second) underfill UF2 36 is applied between the CoW wafer and the package substrate. The underfill material is typically an epoxy molding compound, but can alternatively be a silicone molding compound, a resin molding compound, or another electrically nonconductive molding compound. In one suitable approach, a capillary flow process is used in the operation 54 to form the underfill 36.

In an operation 58, the underfill UF2 36 is cured, typically at a temperature of typically 100-150° C., and more typically at about 125-150° C. for a typical epoxy underfill material, although other cure temperatures may be specified for other types of underfill material. The curing operation 58 can be considered to constitute or include a sub-operation 58A in which substrate warpage and consequent central bump region wetting failure and/or peripheral region bump bridging is controlled or suppressed by ensuring the condition $T_{top} > T_{bottom}$ is met by the package substrate 22 formed in the operation 52. That is, the total metal thickness $T_{top}$ of the top metallization stack 32 should be greater than the total metal thickness $T_{bottom}$ of the bottom metallization stack 34. The curing operation 58 can also be considered to constitute or include a sub-operation 58B in which cracking of the underfill UF2 36 is avoided by ensuring the condition $$\frac{(T_{top} - T_{bottom})}{T_{bottom}} \leq 0.12$$

(or, depending on the detailed construction of the components 20 and 22, a more aggressive condition such as $$\frac{(T_{top} - T_{bottom})}{T_{bottom}} \leq 0.08)$$

is met by the package substrate 22 formed in the operation 52.

The operations 54, 56, and 58 are performed at wafer-level, e.g. with the package substrate 22 being a wafer and similarly for the interposer wafer 16. After the curing operation 58, the CoWoS wafer is diced in an operation 60 to perform singulation to separate the CoWoS wafer into individual a CoWoS semiconductor packages. These CoWoS semiconductor packages may be shipped to customers or otherwise distributed and utilized, for example by mounting a CoWoS semiconductor package on a printed circuit board (PCB) in an operation 62 using ball grid array (BGA) mounting.

In the following, some further embodiments are described.

In a nonlimiting illustrative embodiment, a CoWoS semiconductor assembly comprises a CoW sub-assembly and a package substrate. The CoW sub-assembly includes a plurality of IC dies mounted on a front side of an interposer having through-vias passing through the interposer with ends of the through-vias exposed at a backside of the interposer opposite the front side of the interposer. The package substrate has a front side comprising a top metallization stack and a backside opposite the front side comprising a bottom metallization stack. Bonding bumps connect the backside of the interposer and the front side of the package substrate. The bonding bumps provide electrical connections between the ends of the through-vias exposed at the backside of the interposer and the top metallization stack of the package substrate. A total metal thickness of the top metallization stack of the package substrate is greater than a total metal thickness of the bottom metallization stack of the package substrate.

In some such embodiments, where $$\frac{(T_{top} - T_{bottom})}{T_{bottom}} \leq 0.12$$

$T_{top}$ is the total metal thickness of the top metallization stack of the package substrate and $T_{bottom}$ is the total metal thickness of the bottom metallization stack of the package substrate.

In a nonlimiting illustrative embodiment, a semiconductor assembly includes: a silicon interposer having through-vias passing through the silicon interposer; IC dies mounted on a front side of the silicon interposer and electrically connected with the through vias; and a substrate having a front side comprising a top metallization stack and a backside opposite the front side comprising a bottom metallization stack. A backside of the silicon interposer is secured to the front side of the substrate with electrical connections between ends of the through-vias exposed at the backside of the silicon interposer and the top metallization stack of the substrate. The substrate is configured to warp in a same direction as the silicon interposer when the semiconductor assembly is at 150° C.

In some such embodiments, the substrate is configured to warp in the same direction as the silicon interposer when the semiconductor assembly is at 150° C. by a total metal thickness of the top metallization stack being greater than a total metal thickness of the bottom metallization stack.

In some such embodiments, the CoWoS semiconductor device further includes an underfill material comprising an electrically nonconductive molding compound disposed between the backside of the interposer and the front side of the package substrate, and $$0.01 \leq \frac{(T_{top} - T_{bottom})}{T_{bottom}} \leq 0.12$$

where $T_{top}$ is the total metal thickness of the top metallization stack and $T_{bottom}$ is again the total metal thickness of the bottom metallization stack.

In a nonlimiting illustrative embodiment, a CoWoS semiconductor assembly method is disclosed. A CoW wafer is provided, comprising IC dies mounted on an interposer wafer. A package substrate is formed, including disposing a top metallization stack on a front side of a core and a bottom metallization stack on a backside of the core opposite the front side. Using an array of bonding bumps, the CoW wafer is secured on the front side of the package substrate including electrically connecting through-vias of the interposer wafer with the top metallization stack of the package substrate by the bonding bumps. After the securing, an underfill material is disposed comprising an electrically nonconductive molding compound between the interposer wafer and the package substrate. The underfill material is cured at a temperature of at least 100° C. Warpage of the package substrate is controlled using the top and bottom metal layers to be in a same direction as warpage of the CoW wafer during the curing.

In some such embodiments, the forming of the package substrate includes disposing the top and bottom metallization stacks with a total metal thickness of the top metallization stack being greater than a total metal thickness of the bottom metallization stack.

In some such embodiments, the CoWoS semiconductor assembly method further includes preventing cracking of the underfill material during the curing using the top and bottom metal layers. In some such embodiments, the preventing includes disposing the top and bottom metallization stacks with $$\frac{(T_{top} - T_{bottom})}{T_{bottom}} \leq 0.12$$

where $T_{top}$ is the total metal thickness of the top metallization stack of the package substrate and $T_{bottom}$ is the total metal thickness of the bottom metallization stack of the package substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip-on-wafer-on-substrate (CoWoS) semiconductor assembly comprising:
    a chip-on-wafer (CoW) sub-assembly comprising a plurality of integrated circuit (IC) dies mounted on a front side of an interposer having through-vias passing through the interposer with ends of the through-vias exposed at a backside of the interposer opposite the front side of the interposer;
    a package substrate having a front side comprising a top metallization stack and a backside opposite the front side comprising a bottom metallization stack; and
    bonding bumps connecting the backside of the interposer and the front side of the package substrate with the bonding bumps providing electrical connections between the ends of the through-vias exposed at the backside of the interposer and the top metallization stack of the package substrate;
    wherein a total metal thickness of the top metallization stack of the package substrate is greater than a total metal thickness of the bottom metallization stack of the package substrate.

2. The CoWoS semiconductor assembly of claim 1 wherein:

$$\frac{(T_{top} - T_{bottom})}{T_{bottom}} \leq 0.12$$

where $T_{top}$ is the total metal thickness of the top metallization stack of the package substrate and $T_{bottom}$ is the total metal thickness of the bottom metallization stack of the package substrate.

3. The CoWoS semiconductor assembly of claim 2 wherein:

$$\frac{(T_{top} - T_{bottom})}{T_{bottom}} \geq 0.01$$

where $T_{top}$ is the total metal thickness of the top metallization stack of the package substrate and $T_{bottom}$ is the total metal thickness of the bottom metallization stack of the package substrate.

4. The CoWoS semiconductor assembly of claim 1 wherein:

$$\frac{(T_{top} - T_{bottom})}{T_{bottom}} \leq 0.08$$

where $T_{top}$ is the total metal thickness of the top metallization stack of the package substrate and $T_{bottom}$ is the total metal thickness of the bottom metallization stack of the package substrate.

5. The CoWoS semiconductor assembly of claim 1 further comprising an underfill material comprising an electrically nonconductive molding compound disposed between the backside of the interposer and the front side of the package substrate.

6. The CoWoS semiconductor assembly of claim 1 wherein the package substrate includes a planar core disposed between the top metallization stack and the bottom metallization stack, the planar core having an in-plane coefficient of thermal expansion (CTE) of 15 ppm/° C. or less over a temperature range of 30-120° C.

7. The CoWoS semiconductor assembly of claim 1 wherein the CoWoS semiconductor assembly is a CoWoS semiconductor package produced by singulation of a CoWoS semiconductor wafer.

8. The CoWoS semiconductor assembly of claim 1 wherein the CoWoS semiconductor assembly is a CoWoS semiconductor wafer and the package substrate is configured by the top metallization stack and the bottom metallization stack to warp in a same direction as the CoW subassembly when the CoWoS semiconductor wafer is heated from 30° C. to 150° C.

9. The CoWoS semiconductor device of claim 1 wherein:
the package substrate includes a planar core disposed between the top metallization stack and the bottom metallization stack, the planar core having an in-plane coefficient of thermal expansion (CTE) of 15 ppm/° C. or less over a temperature range of 30-120° C.;
the CoWoS semiconductor device further includes an underfill material comprising an electrically nonconductive molding compound disposed between the backside of the interposer and the front side of the package substrate; and $$0.01 \leq \frac{(T_{top} - T_{bottom})}{T_{bottom}} \leq 0.12$$

where $T_{top}$ is the total metal thickness of the top metallization stack of the package substrate and $T_{bottom}$ is the total metal thickness of the bottom metallization stack of the package substrate.

10. The CoWoS semiconductor device of claim 9 wherein:

$$\frac{T_{core}}{(T_{top} + T_{bottom})} \geq 3.0$$

where $T_{core}$ is the thickness of the planar core.

11. A semiconductor assembly comprising:
a silicon interposer having through-vias passing through the silicon interposer;
integrated circuit (IC) dies mounted on a front side of the silicon interposer and electrically connected with the through-vias; and
a substrate having a front side comprising a top metallization stack and a backside opposite the front side comprising a bottom metallization stack, a backside of the silicon interposer being secured to the front side of the substrate with electrical connections between ends of the through-vias exposed at the backside of the silicon interposer and the top metallization stack of the substrate;
wherein the substrate is configured to warp in a same direction as the silicon interposer when the semiconductor assembly is at 150° C.

12. The semiconductor assembly of claim 11 wherein the substrate is configured to warp in the same direction as the silicon interposer when the semiconductor assembly is at 150° C. by a total metal thickness of the top metallization stack being greater than a total metal thickness of the bottom metallization stack.

13. The semiconductor assembly of claim 11 wherein:

$$0.01 \leq \frac{(T_{top} - T_{bottom})}{T_{bottom}} \leq 0.12$$

where $T_{top}$ is the total metal thickness of the top metallization stack and $T_{bottom}$ is the total metal thickness of the bottom metallization stack.

14. The semiconductor assembly of claim 11 further comprising:
an underfill material comprising an electrically nonconductive molding compound disposed between the backside of the interposer and the front side of the substrate.

15. The semiconductor assembly of claim 11 wherein the package substrate includes a planar core disposed between the top metallization stack and the bottom metallization stack, the planar core having an in-plane coefficient of thermal expansion (CTE) of 15 ppm/° C. or less over a temperature range of 30-120° C.

16. A chip-on-wafer-on-substrate (CoWoS) semiconductor assembly method comprising:
providing a chip-on-wafer (CoW) wafer comprising integrated circuit (IC) dies mounted on an interposer wafer;
forming a package substrate including disposing a top metallization stack on a front side of a core and a bottom metallization stack on a backside of the core opposite the front side;
using an array of bonding bumps, securing the CoW wafer on the front side of the package substrate including electrically connecting through-vias of the interposer wafer with the top metallization stack of the package substrate by the bonding bumps;
after the securing, disposing an underfill material comprising an electrically nonconductive molding compound between the interposer wafer and the package substrate;
curing the underfill material at a temperature of at least 100° C.; and
controlling warpage of the package substrate during the curing using the top and bottom metal layers to be in a same direction as warpage of the CoW wafer during the curing.

17. The CoWoS semiconductor assembly method of claim 16 wherein the forming of the package substrate includes disposing the top and bottom metallization stacks with a total metal thickness of the top metallization stack being greater than a total metal thickness of the bottom metallization stack.

18. The CoWoS semiconductor assembly method of claim 17 further comprising:
preventing cracking of the underfill material during the curing using the top and bottom metal layers.

19. The CoWoS semiconductor assembly method of claim 18 wherein the preventing includes disposing the top and bottom metallization stacks with:

$$\frac{(T_{top} - T_{bottom})}{T_{bottom}} \leq 0.12$$

where $T_{top}$ is the total metal thickness of the top metallization stack of the package substrate and $T_{bottom}$ is the total metal thickness of the bottom metallization stack of the package substrate.

20. The CoWoS semiconductor assembly method of claim 16 further comprising:
after the curing, dicing an assembly comprising the CoW wafer secured to the front side of the package substrate to separate CoWoS semiconductor packages.

* * * * *